United States Patent
Yamada et al.

(10) Patent No.: US 9,704,743 B2
(45) Date of Patent: Jul. 11, 2017

(54) METHOD FOR MANUFACTURING SILICON CARBIDE SEMICONDUCTOR DEVICE

(71) Applicant: Sumitomo Electric Industries, Ltd., Osaka-shi (JP)

(72) Inventors: Shunsuke Yamada, Osaka (JP); Tetsuya Hattori, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/902,185

(22) PCT Filed: May 23, 2014

(86) PCT No.: PCT/JP2014/063653
§ 371 (c)(1),
(2) Date: Dec. 30, 2015

(87) PCT Pub. No.: WO2015/001863
PCT Pub. Date: Jan. 8, 2015

(65) Prior Publication Data
US 2016/0372370 A1   Dec. 22, 2016

(30) Foreign Application Priority Data
Jul. 4, 2013   (JP) .................................. 2013-140752

(51) Int. Cl.
*H01L 21/00* (2006.01)
*H01L 21/768* (2006.01)
(Continued)

(52) U.S. Cl.
CPC .... *H01L 21/76889* (2013.01); *H01L 21/0485* (2013.01); *H01L 21/76805* (2013.01);
(Continued)

(58) Field of Classification Search
CPC ............ H01L 29/1608; H01L 29/7802; H01L 29/41741; H01L 21/76889; H01L 21/0485;
(Continued)

(56) References Cited

U.S. PATENT DOCUMENTS

2007/0045631 A1   3/2007   Endo et al.
2008/0283845 A1   11/2008  Endo et al.
(Continued)

FOREIGN PATENT DOCUMENTS

JP   2006-041248 A   2/2006
JP   2007-096263 A   4/2007
(Continued)

OTHER PUBLICATIONS

International Search Report in International Patent Application No. PCT/JP2014/063653, dated Sep. 2, 2014.

*Primary Examiner* — Richard Booth
(74) *Attorney, Agent, or Firm* — Venable LLP; Michael A. Sartori; F. Brock Riggs (57) ABSTRACT

An insulating layer is formed on a substrate made of silicon carbide. By performing etching using a mask layer formed on the insulating layer, a contact hole is formed in the insulating layer to expose a contact region, which is a portion of a main surface of the substrate. The step of forming the contact hole includes a step of providing the contact region with a surface roughness Ra of not less than 0.5 nm. An electrode layer is formed in contact with the contact region. By heating the electrode layer and the substrate, siliciding reaction is caused between the electrode layer and the contact region.

7 Claims, 7 Drawing Sheets (51) Int. Cl.

| | | |
|---|---|---|
| *H01L 21/04* | (2006.01) | |
| *H01L 29/34* | (2006.01) | |
| *H01L 29/66* | (2006.01) | |
| *H01L 29/04* | (2006.01) | |
| *H01L 29/16* | (2006.01) | |
| *H01L 29/45* | (2006.01) | |
| *H01L 29/78* | (2006.01) | |
| *H01L 29/739* | (2006.01) | |
| *H01L 29/417* | (2006.01) | |

(52) U.S. Cl.
CPC ...... *H01L 21/76895* (2013.01); *H01L 29/045* (2013.01); *H01L 29/1608* (2013.01); *H01L 29/34* (2013.01); *H01L 29/45* (2013.01); *H01L 29/66068* (2013.01); *H01L 29/7802* (2013.01); *H01L 29/41741* (2013.01); *H01L 29/7395* (2013.01)

(58) Field of Classification Search
CPC .............. H01L 29/34; H01L 29/66068; H01L 21/76895; H01L 21/76805; H01L 29/45; H01L 29/045; H01L 29/7395
See application file for complete search history.

(56) References Cited

U.S. PATENT DOCUMENTS

| | | |
|---|---|---|
| 2012/0184094 A1 | 7/2012 | Yamada |
| 2012/0319134 A1 | 12/2012 | Honaga et al. |
| 2013/0017677 A1 | 1/2013 | Horii et al. |
| 2013/0119407 A1 | 5/2013 | Masuda et al. |

FOREIGN PATENT DOCUMENTS

| | | |
|---|---|---|
| JP | 2008-053343 A | 3/2008 |
| JP | 2008-135611 A | 6/2008 |
| JP | 2012-146838 A | 8/2012 |
| JP | 2013-004636 A | 1/2013 |
| JP | 2013-026248 A | 2/2013 |
| JP | 2013-105966 A | 5/2013 |
| WO | WO-2013/140764 A1 | 9/2013 |

METHOD FOR MANUFACTURING SILICON CARBIDE SEMICONDUCTOR DEVICE

TECHNICAL FIELD

The present invention relates to a method for manufacturing a silicon carbide semiconductor device, in particular, a method for manufacturing a silicon carbide semiconductor device using siliciding reaction.

BACKGROUND ART

Japanese Patent Laying-Open No. 2013-105966 (Patent Document 1) discloses that siliciding reaction is employed when forming a source electrode in a method for manufacturing a MOSFET (Metal Oxide Semiconductor Field Effect Transistor) using a silicon carbide substrate. First, in a region to be provided with the source electrode, an interlayer insulating film and a gate insulating film are removed. A Ni film is formed in this region. Then, heat treatment is provided, thereby siliciding at least a portion of the Ni film. Accordingly, the source electrode serving as an ohmic electrode is formed.

CITATION LIST

Patent Document

PTD 1: Japanese Patent Laying-Open No. 2013-105966

SUMMARY OF INVENTION

Technical Problem

In order to attain low on resistance in a silicon carbide semiconductor device, contact resistance between a substrate and an electrode is desirably low. If it is permitted to increase a contact area between the substrate and the electrode without any restriction, contact resistance can be readily made low; however, there is normally a restriction on the contact area due to a restriction on the size of the semiconductor device.

The present invention has been made to solve the foregoing problem. The present invention has a main object to provide a method for manufacturing a silicon carbide semiconductor device allowing for low contact resistance while suppressing a contact area between a substrate and an electrode layer.

Solution to Problem

A method for manufacturing a silicon carbide semiconductor device of the present invention has the following steps.

An insulating layer is formed on a substrate having a main surface and made of silicon carbide. A mask layer having an opening is formed on the insulating layer. A contact hole is formed in the insulating layer to expose a contact region by etching the insulating layer using the mask layer, the contact region being a portion of the main surface of the substrate. The step of forming the contact hole includes a step of providing the contact region with a surface roughness Ra of not less than 0.5 nm. An electrode layer is formed in contact with the contact region of the substrate. Siliciding reaction is caused between the electrode layer and the contact region of the substrate by heating the electrode layer and the substrate.

Advantageous Effects of Invention

According to the present invention, contact resistance can be more securely made low.

DESCRIPTION OF EMBODIMENTS

The following describes an embodiment of the present invention based on figures. It should be noted that in the below-mentioned figures, the same or corresponding portions are given the same reference characters and are not described repeatedly. Regarding crystallographic indications in the present specification, an individual orientation is represented by [ ], a group orientation is represented by < >, and an individual plane is represented by ( ), and a group plane is represented by { }. In addition, a negative crystallographic index is normally expressed by putting "-" (bar) above a numeral, but is expressed by putting the negative sign before the numeral in the present specification.

The following first describe an overview with regard to (i) to (ix).

(i) A method for manufacturing a silicon carbide semiconductor device 100 includes the following steps. An insulating layer 20 is formed on a substrate 10 having a main surface 10A and made of silicon carbide. A mask layer 80 having an opening OP is formed on insulating layer 20. A contact hole CH is formed in insulating layer 20 to expose a contact region CR by etching insulating layer 20 using mask layer 80, contact region CR being a portion of main surface 10A of substrate 10. The step of forming contact hole CH includes a step of providing contact region CR with a surface roughness Ra of not less than 0.5 nm. An electrode layer 52 is formed in contact with contact region CR of substrate 10. Siliciding reaction is caused between electrode layer 52 and contact region CR of substrate 10 by heating electrode layer 52 and substrate 10.

According to the manufacturing method, contact region CR in which electrode layer 52 is to be formed is made rough to have a surface roughness Ra of not less than 0.5 nm. Accordingly, microscopic irregularities are formed in contact region CR. As a result, irrespective of the macroscopic crystallographic plane orientation of main surface 10A of substrate 10, contact region CR microscopically has various plane orientations. Hence, an influence of plane orientation dependency of the siliciding rate can be suppressed when causing the siliciding reaction between electrode layer 52 and contact region CR. Accordingly, sufficient silicidation can be more securely attained, thereby reducing contact resistance more securely.

(ii) In (i), substrate 10 may have a hexagonal crystal structure. In this case, the siliciding rate has plane orientation dependency in the hexagonal crystal structure but the influence of the plane orientation dependency can be suppressed.

(iii) In (ii), main surface 10A of substrate 10 may have an off angle of not more than 10° relative to a {0001} plane. In this case, if surface roughness Ra of contact region CR is small, the siliciding rate will become particularly low. When surface roughness Ra of contact region CR is increased, the plane orientation dependency of the siliciding rate is suppressed as described above, thereby preventing decrease of the siliciding rate. Therefore, contact resistance can be made small.

(iv) In (i) to (iii), the step of forming electrode layer 52 may include a step of depositing a material having at least one of Ni atom and Ti atom. Accordingly, the material of electrode layer 52 can be suitable for causing the siliciding reaction.

(v) In (i) to (iv), the step of forming insulating layer 20 may include a step of providing insulating layer 20 with a surface roughness Ra of not less than 0.5 nm. Accordingly, large surface roughness Ra of insulating layer 20 is transferred to contact region CR, thereby attaining a large surface roughness Ra of contact region CR.

(vi) In (i) to (v), the step of providing contact region CR with a surface roughness Ra of not less than 0.5 nm may include a step of making contact region CR rough. Accordingly, even when surface roughness Ra of contact region CR immediately after being exposed is less than 0.5 nm, surface roughness Ra of contact region CR can be not less than 0.5 nm before the formation of electrode layer 52.

(vii) In (vi), the step of making contact region CR rough may include steps of subjecting contact region CR to oxygen plasma; and etching contact region CR after the step of subjecting contact region CR to the oxygen plasma. The step of etching contact region CR may be performed under conditions that an etching rate for silicon carbide is larger than an etching rate for silicon oxide.

In this case, due to the oxygen plasma, Si atoms of SiC are oxidized more as compared with C atoms of SiC, thus resulting in microscopic nonuniformity in oxidation reaction. With subsequent etching, surface roughness Ra can be made large.

(viii) In (vii), the step of making contact region CR rough may be repeatedly performed for a plurality of times. Accordingly, contact region CR can have a surface roughness Ra of not less than 0.5 nm more securely.

(ix) In (vii) or (viii), the step of etching contact region CR may include a step of performing dry etching using a gas including sulfur hexafluoride. Accordingly, an etching rate for silicon carbide can be made larger than an etching rate for silicon oxide.

Next, details will be described in first and second embodiments below.

First Embodiment

Figure 1:
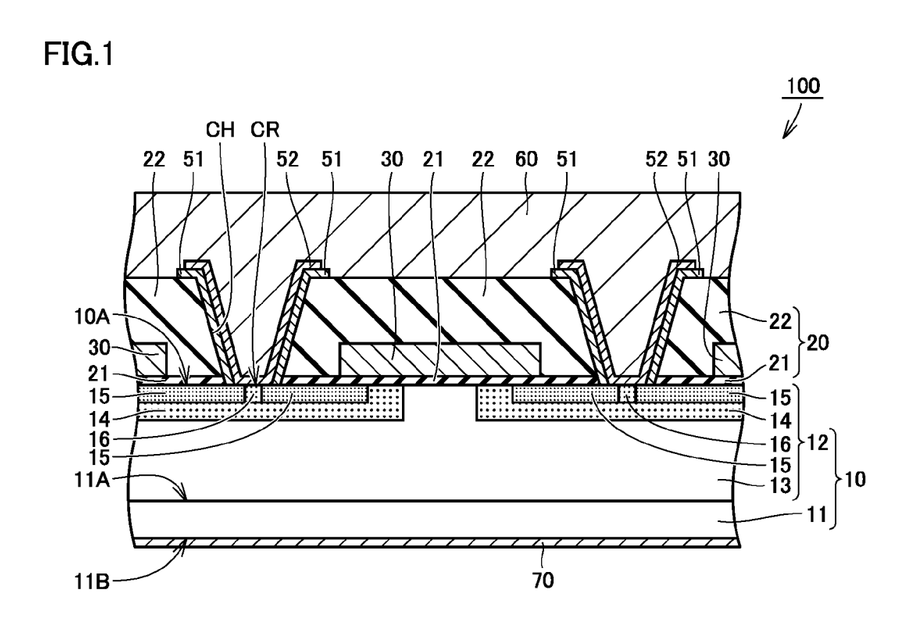
FIG. 1 is a partial cross sectional view schematically showing a configuration of a silicon carbide semiconductor device in a first embodiment of the present invention.

A MOSFET 100 (silicon carbide semiconductor device) of the present embodiment is a power semiconductor device, and has a so-called vertical type structure for a current path. Specifically, MOSFET 100 has an epitaxial substrate 10 (substrate), insulating layers 20, gate electrodes 30, buffer films 51, source electrodes 52 (electrode layer), a source interconnection layer 60, and a drain electrode 70.

Epitaxial substrate 10 is made of carbide having n type (first conductivity type). Epitaxial substrate 10 has an upper surface 10A (main surface) and a backside surface 11B opposite to upper surface 10A. Epitaxial substrate 10 includes a base substrate 11 constituting backside surface 11B; and an epitaxial layer 12 constituting upper surface 10A. Base substrate 11 and epitaxial layer 12 are provided on each other via an interface 11A. Substrate 10 preferably has a hexagonal crystal structure. In this case, upper surface 10A preferably has an off angle of not more than 10° relative to a {0001} plane and more preferably not more than 5° relative to the {0001} plane. Moreover, this off angle is preferably not less than 2° and more preferably not less than 3°.

Epitaxial layer 12 has an n⁻ drift portion 13, p body portions 14, n source portions 15, and p contact portions 16. N⁻ drill portion 13 is provided on interface 11A. N⁻ drill portion 13 has n type and has an impurity concentration lower than the impurity concentration of base substrate 11. P body portion 14 is provided on n⁻ drift portion 13 such that p body portion 14 is separated from interface 11A by n⁻ drift portion 13. P body portion 14 partially constitutes upper surface 10A. P body portion 14 has p type (second conductivity type). N source portion 15 partially constitutes upper surface 10A. N source portion 15 is separated from n⁻ drift portion 13 by p body portion 14. N source portion 15 has n type and has an impurity concentration higher than the impurity concentration of n⁻ drift portion 13. P contact portion 16 partially constitutes upper surface 10A and is connected to p body portion 14. P contact portion 16 has p type and has an impurity concentration higher than the impurity concentration of p body portion 14.

Gate insulating film 21 is directly provided on a portion of upper surface 10A of substrate 10. More specifically, gate insulating film 21 is directly provided on p body portion 14 to connect n source portion 15 and n⁻ drift portion 13 to each other. A portion of upper surface 10A covered with gate insulating film 21, particularly, a portion of upper surface 10A constituted of p body portion 14 preferably has a surface roughness Ra of less than 0.5 nm, and more preferably has Ra of less than 0.2 nm. Gate insulating film 21 is preferably made of $SiO_2$ (silicon dioxide). Interlayer insulating film 22 is provided on gate insulating film 21. Interlayer insulating film 22 is preferably made of $SiO_2$ (silicon dioxide).

Gate electrode 30 is interposed between gate insulating film 21 and interlayer insulating film 22. In other words, gate electrode 30 is embedded in insulating layer 20 having gate insulating film 21 and interlayer insulating film 22. A contact hole CH is provided in insulating layer 20. Contact hole CH extends through interlayer insulating film 22 and gate insulating film 21. Contact hole CH exposes a contact region CR, which is a portion of upper surface 10A of substrate 10. Contact region CR exposes each of n source portion 15 and p contact portion 16.

Gate electrode 30 is provided on gate insulating film 21, and has a portion disposed on p body portion 14 with gate insulating film 21 being interposed therebetween. Gate electrode 30 is made of for example, doped polysilicon.

Buffer film 51 covers a side wall surface of contact hole CH, i.e., a side surface of insulating layer 20. Specifically, in contact hole CH, buffer film 51 covers each of side surfaces of gate insulating film 21 and interlayer insulating film 22. Preferably, buffer film 51 contains no Al and Si atoms, and is made of, for example, titanium nitride (TiN), tungsten nitride (TiW), or tantalum nitride (TaN). Buffer film 51 has a thickness of not less than 0.025 μm and not more than 0.15 μm, for example.

Source electrode 52 is in contact with contact region CR exposed through contact hole CH. Source electrode 52 is separated from gate insulating film 21 by buffer film 51. Source electrode 52 preferably contains at least one of Ni atom and Ti atom, and is made of a TiAlSi alloy, for example.

Drain electrode 70 is provided on backside surface 11B of epitaxial substrate 10. Drain electrode 70 can be made of the same material as the material of source electrode 52.

Source interconnection layer 60 is formed to cover source electrode 52 and interlayer insulating film 22. Source interconnection layer 60 preferably contains Al atom, and is an aluminum layer or an aluminum alloy layer, for example.

The following describes a method for manufacturing MOSFET 100.

Figure 2:
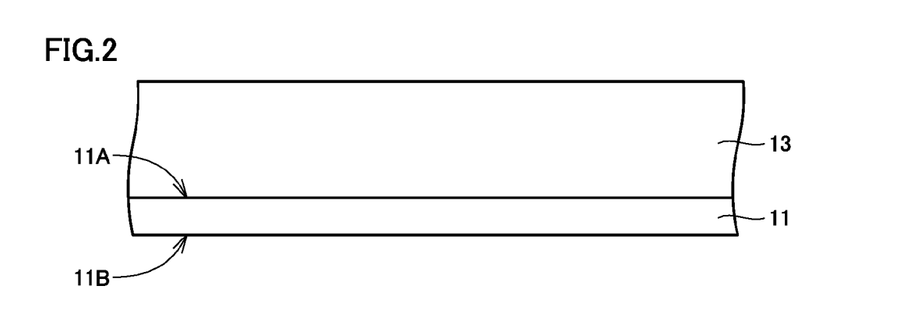
FIG. 2 is a partial cross sectional view schematically showing a first step of a method for manufacturing the silicon carbide semiconductor device in the first embodiment of the present invention.

As shown in FIG. 2, n⁻ drift portion 13 is first formed by epitaxial growth on base substrate 11. The epitaxial growth can be performed by a chemical vapor deposition (CVD) method.

Figure 3:
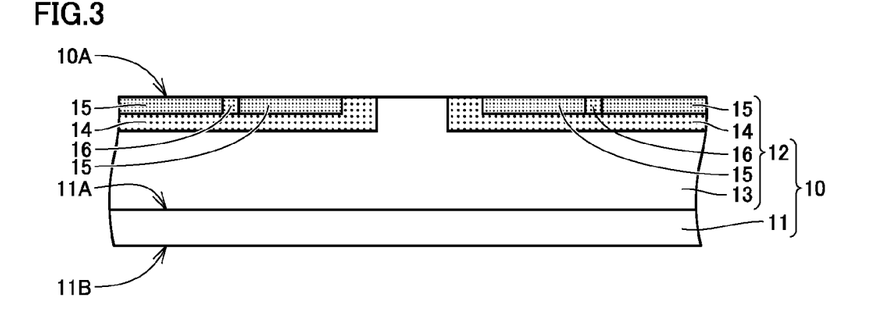
FIG. 3 is a partial cross sectional view schematically showing a second step of the method for manufacturing the silicon carbide semiconductor device in the first embodiment of the present invention.

As shown in FIG. 3, p body portion 14, n source portion 15, and p contact portion 16 are formed on n⁻ drift portion 13. They can be formed by an ion implantation method. Next, activation annealing is performed by heating substrate 10. In this way, substrate 10 is prepared. At this point of time, upper surface 10A preferably has a surface roughness Ra of less than 0.5 nm, more preferably less than 0.2 nm.

Figure 4:
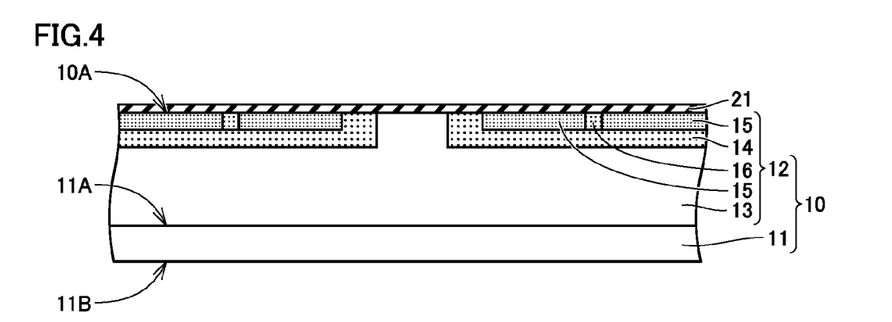
FIG. 4 is a partial cross sectional view schematically showing a third step of the method for manufacturing the silicon carbide semiconductor device in the first embodiment of the present invention.
Figure 13:
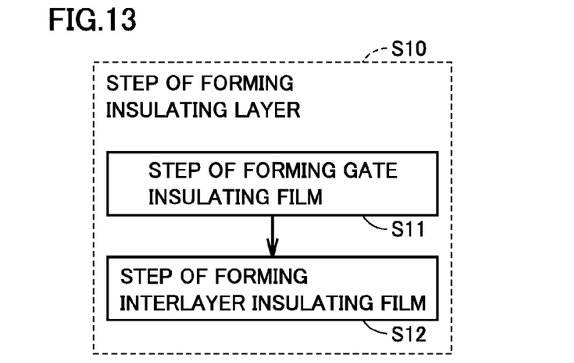
FIG. 13 is a flowchart schematically showing a step or forming an insulating layer in the first embodiment of the present invention.

As shown in FIG. 4, gate insulating film 21 is formed on upper surface 10A of substrate 10 (FIG. 13: step S11). Gate insulating film 21 is preferably formed by thermal oxidation of upper surface 10A of substrate 10.

Figure 5:
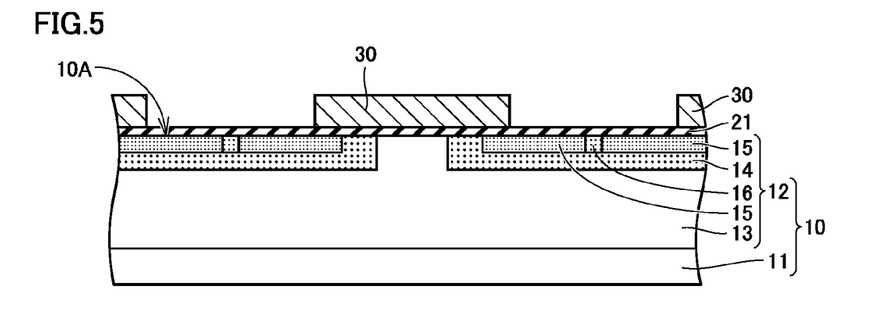
FIG. 5 is a partial cross sectional view schematically showing a fourth step of the method for manufacturing the silicon carbide semiconductor device in the first embodiment of the present invention.

As shown in FIG. 5, gate electrode 30 is formed on gate insulating film 21. Gate electrode 30 is formed by forming a film of doped polysilicon using the CVD method and by performing patterning using a photolithography method, for example.

Figure 6:
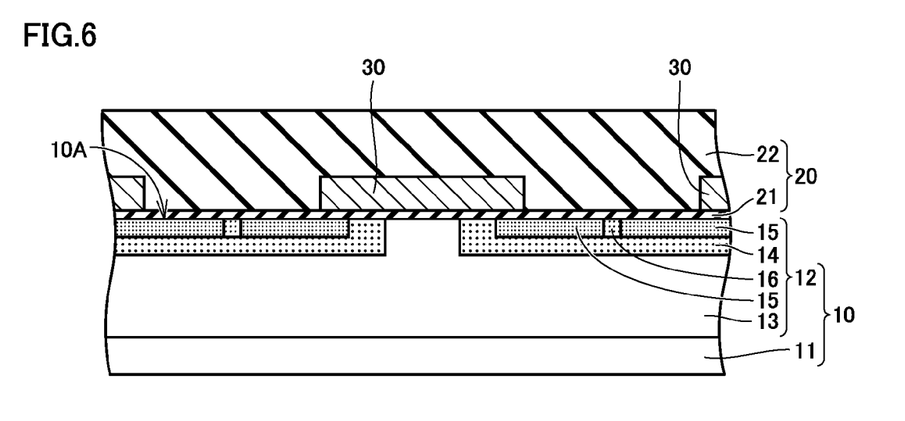
FIG. 6 is a partial cross sectional view schematically showing a fifth step of the method for manufacturing the silicon carbide semiconductor device in the first embodiment of the present invention.

As shown in FIG. 6, interlayer insulating film 22 is formed to cover gate electrode 30 (FIG. 13: step S12). Accordingly, insulating layer 20 having gate insulating film 21 and interlayer insulating film 22 is formed on upper surface 10A of substrate 10 (FIG. 13: step S10). Interlayer insulating film 22 can be formed by deposition of $SiO_2$ using a plasma CVD method, for example. In the present embodiment, the step of forming interlayer insulating film 22 included in insulating layer 20 is performed such that the surface of insulating layer 20 (the upper surface of insulating layer 20 in FIG. 6) has a surface roughness Ra of not less than 0.5 nm. A large surface roughness Ra is obtained by forming interlayer insulating film 22 at a high growth rate, for example. However, this surface roughness Ra is preferably not more than 50 nm, more preferably not more than 10 nm, and further preferably not more than 5 nm.

Figure 7:
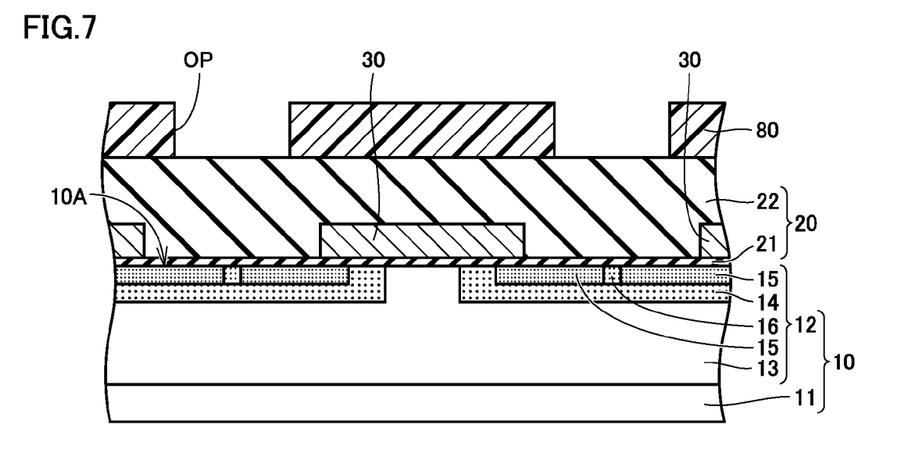
FIG. 7 is a partial cross sectional view schematically showing a sixth step of the method for manufacturing the silicon carbide semiconductor device in the first embodiment of the present invention.

As shown in FIG. 7, a mask layer 80 having an opening OP is formed on interlayer insulating film 22 of insulating layer 20. Mask layer 80 is a resist pattern formed by the photolithography method, for example.

Figure 8:
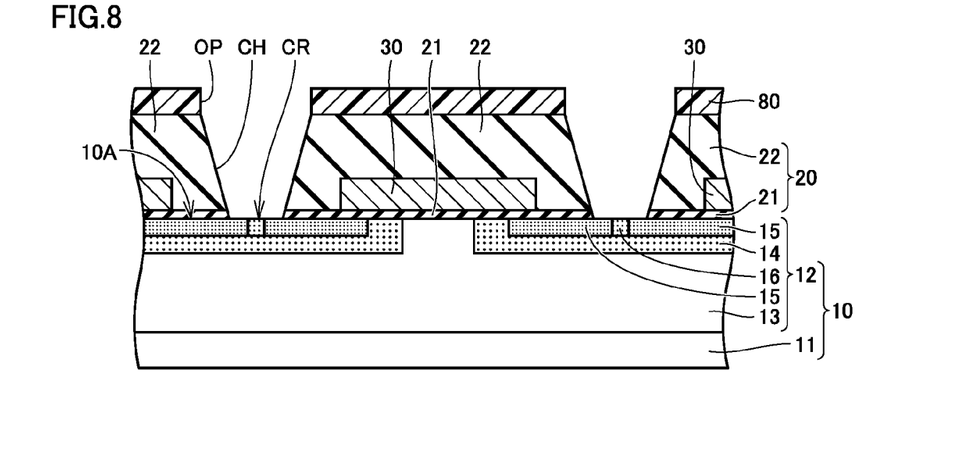
FIG. 8 is a partial cross sectional view schematically showing a seventh step of the method for manufacturing the silicon carbide semiconductor device in the first embodiment of the present invention.

As shown in FIG. 8, insulating layer 20 is etched using mask layer 80. For the etching, reactive ion etching (RIE) can be employed. In the RIE, a fluorine-based gas is preferably employed for a reactive gas, such as a mixed gas of $CF_4$ and $CHF_3$. The reactive gas may be mixed in a carrier gas. The carrier gas is preferably Ar gas.

Figure 9:
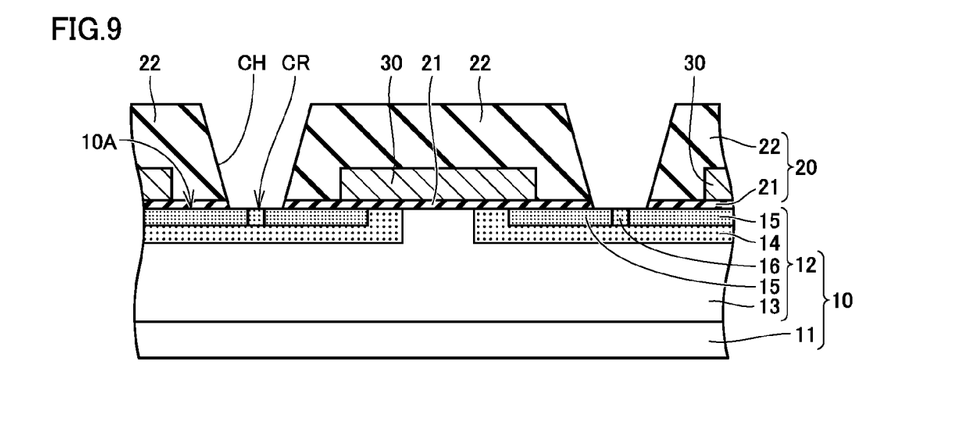
FIG. 9 is a partial cross sectional view schematically showing an eighth step of the method for manufacturing the silicon carbide semiconductor device in the first embodiment of the present invention.

By this etching, contact hole CH is formed in insulating layer 20 to expose contact region CR, which is a portion of upper surface 10A of substrate 10. Fine irregularities of the upper surface of insulating layer 20 having existed on contact region CR are transferred to contact region CR. Since the upper surface of insulating layer 20 has a surface roughness Ra of not less than 0.5 nm in the present embodiment, contact region CR also has a surface roughness Ra of not less than 0.5 nm. Namely, upon the formation of contact hole CH, contact region CR is made rough to have a surface roughness Ra of not less than 0.5 nm. It should be noted that this surface roughness Ra is preferably not more than 50 nm, more preferably not more than 10 nm, and further preferably not more than 5 nm. Next, mask layer 80 is removed (FIG. 9).

Figure 10:
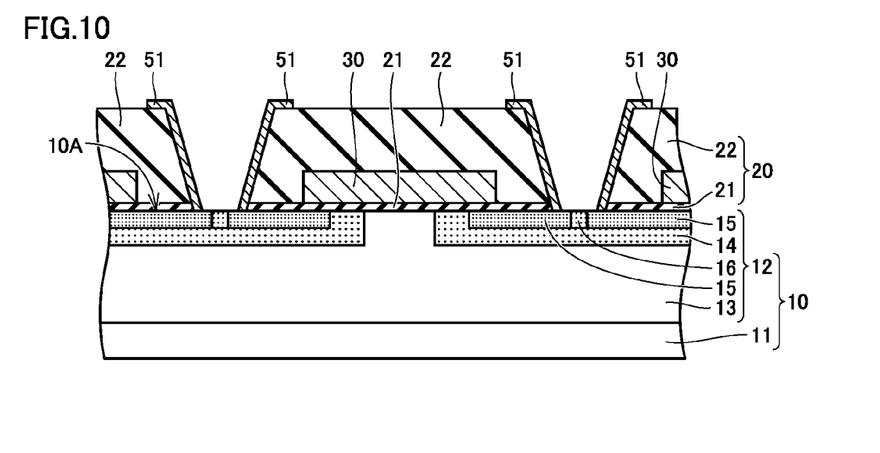
FIG. 10 is a partial cross sectional view schematically showing a ninth step of the method for manufacturing the silicon carbide semiconductor device in the first embodiment of the present invention.

As shown in FIG. 10, buffer film 51 is formed. Buffer film 51 can be formed by forming a film using, a sputtering method and by performing patterning using the photolithography method.

Figure 11:
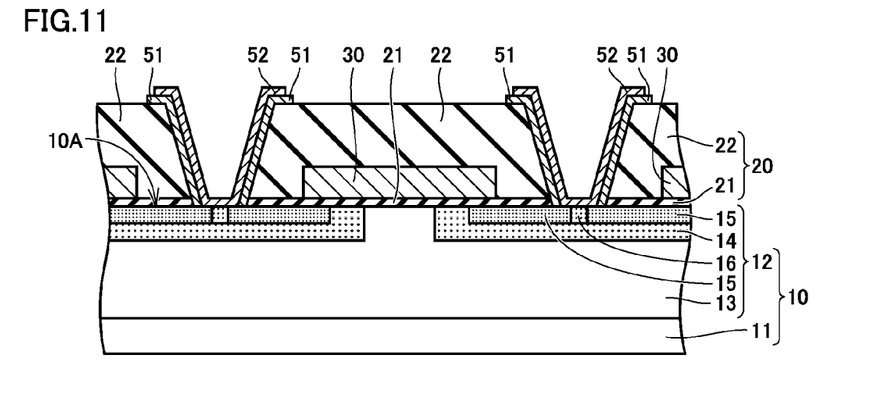
FIG. 11 is a partial cross sectional view schematically showing a tenth step of the method for manufacturing the silicon carbide semiconductor device in the first embodiment of the present invention.

As shown in FIG. 11, source electrode 52 is formed in contact with contact region CR or substrate 10. On this occasion, a material having at least one of Ni atom and Ti atom is preferably deposited. For example, a laminate film of a Ti layer, an Al layer, and a Si layer is first formed by the sputtering method. Then, this laminate film is patterned using the photolithography method.

Next, source electrode 52 and substrate 10 are heated, thereby causing siliciding reaction between source electrode 52 and contact region CR of substrate 10. Accordingly, electric contact between source electrode 52 and contact region CR becomes more ohmic. Moreover, source electrode 52 is alloyed by this heating. The heating is preferably performed at a temperature of not less than 950° C. and not more than 1050° C., such as about 1000° C.

Figure 12:
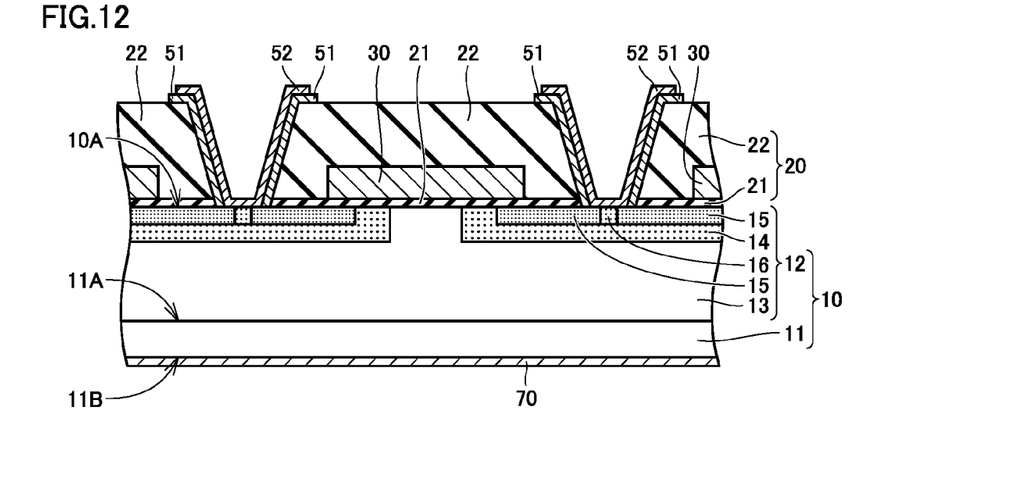
FIG. 12 is a partial cross sectional view schematically showing an eleventh step of the method for manufacturing the silicon carbide semiconductor device in the first embodiment of the present invention.

As shown in FIG. 12, drain electrode 70 is formed. Drain electrode 70 may be formed by the same method as that for source electrode 52. It should be noted that source electrode 52 and drain electrode 70 may be heated collectively. With reference to FIG. 1 again, source interconnection layer 60 is formed. Accordingly, MOSFET 100 is obtained.

According to the present embodiment, contact region CR in which source electrode 52 is to be formed is made rough to have a surface roughness Ra of not less than 0.5 nm. Accordingly, microscopic irregularities are formed in contact region CR. As a result, irrespective of the macroscopic crystallographic plane orientation of main surface 10A of substrate 10, contact region CR microscopically has various plane orientations. Hence, an influence of plane orientation dependency of the siliciding rate can be suppressed when causing the siliciding reaction between source electrode 52 and contact region CR. Accordingly, sufficient silicidation can be more securely attained, thereby reducing contact resistance more securely.

Moreover, upon the formation of insulating layer 20, insulating layer 20 is provided with a surface roughness Ra of not less than 0.5 nm. Accordingly, large surface roughness Ra of insulating layer 20 is transferred to contact region CR, thereby attaining a large surface roughness Ra of contact region CR.

Moreover, because surface roughness Ra of contact region CR does not become too large, a fine recess formed in contact region CR can be prevented from extending to p body portion 14 through n source portion 15 or p contact portion 16. In view of this, contact region CR preferably has a surface roughness Ra of not more than 50 nm, more preferably not more than 10 nm, and further preferably not more than 5 nm. To attain this, surface roughness Ra of insulating layer 20 is preferably not more than 50 nm, more preferably not more than 10 nm, and further preferably not more than 5 nm.

Moreover, substrate 10 may have a hexagonal crystal structure. In this case, the siliciding rate has plane orientation dependency in the hexagonal crystal structure but the influence of the plane orientation dependency can be suppressed. Particularly, if surface roughness Ra of contact region CR is small when upper surface 10A of substrate 10 has an off angle of not more than 10° relative to the {0001} plane, the siliciding rate will become particularly low. When surface roughness Ra of contact region CR is increased, the plane orientation dependency of the siliciding rate is suppressed as described above, thereby preventing decrease of the siliciding rate. Therefore, contact resistance can be made small.

Moreover, the step of forming source electrode 52 may include a step of depositing a material having at least one of Ni atom and Ti atom. Accordingly, the material of source electrode 52 can be suitable for causing the siliciding reaction.

Second Embodiment

In the present embodiment, substantially the same steps as those in FIG. 2 to FIG. 9 of the first embodiment are performed first. However, in the present embodiment, unlike the first embodiment, insulating layer 20 does not necessarily have a surface roughness Ra of not less than 0.5 nm upon the formation of insulating layer 20. In this case, surface roughness Ra of contact region CR immediately after being exposed can be less than 0.5 nm. Hence, after contact region CR is exposed, a step (FIG. 14: step S20) of making contact region CR rough is performed to ensure that contact region CR (FIG. 9) has a surface roughness Ra of not less than 0.5 nm. However, this surface roughness Ra is preferably not more than 50 nm, more preferably not more than 10 nm, and further preferably not more than 5 nm.

Specifically, as the step (FIG. 14: step S20) of making contact region CR rough, the following steps are performed: a step (FIG. 14: step S21) of subjecting contact region CR to oxygen plasma; and a step (FIG. 14: step S22) of etching contact region CR. The step of etching contact region CR is performed under conditions that an etching rate for silicon carbide is larger than an etching rate for silicon oxide. The etching involving such conditions can be performed by dry etching employing a process gas including sulfur hexafluoride ($SF_6$) as a reactive gas. Then, the same steps as those in FIG. 10 to FIG. 12 of the first embodiment are performed.

According to the present embodiment, after contact region CR is exposed, contact region CR is made rough. Accordingly, even when surface roughness Ra of contact region CR immediately alter being exposed is less than 0.5 nm, surface roughness Ra of contact region CR can be not less than 0.5 nm before the formation of source electrode 52.

Specifically, first, contact region CR is subjected to oxygen plasma, whereby Si atoms of SiC arc oxidized more as compared with C atoms of SiC. This results in microscopic nonuniformity in the oxidation reaction. After this, contact region CR is etched under conditions that the etching rate for silicon carbide (SiC) is larger than the etching rate for silicon oxide. With this etching, surface roughness Ra can be made large.

Figure 14:
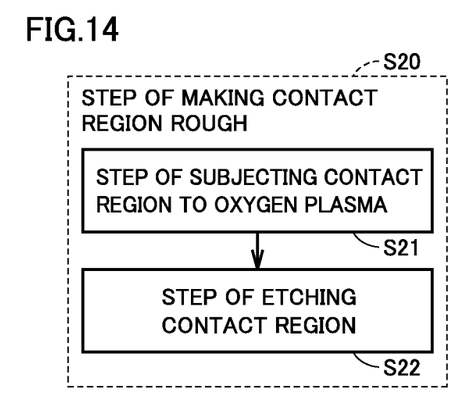
FIG. 14 is a flowchart schematically showing a step of making a contact region rough in a second embodiment of the present invention.
Figure 15:
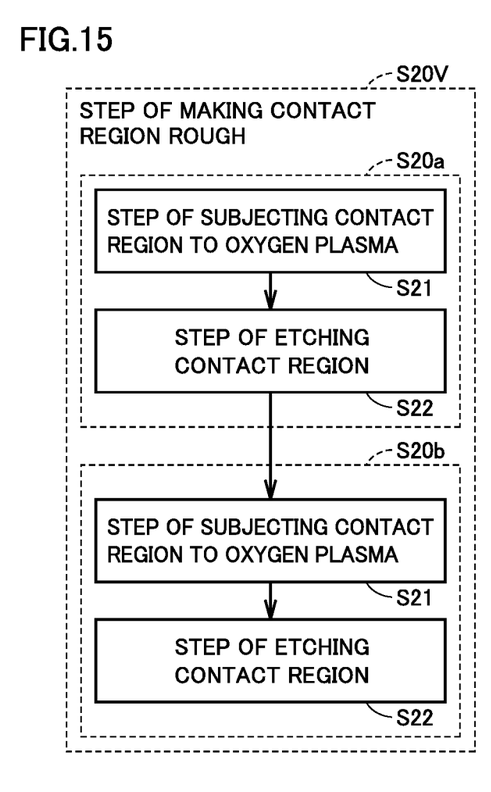
FIG. 15 is a flowchart showing a modification of FIG. 14.

It should be noted that instead of performing step S20 of making contact region CR rough once as described above, steps S20a and S20b of making contact region CR rough may be performed. That is, a step S20V (FIG. 15) of repeatedly performing the step of making, contact region CR rough for a plurality of times may be performed. Each of steps S20a and S20b may be performed in a similar manner to step S20 (FIG. 14). Accordingly, contact region CR can have a surface roughness Ra of not less than 0.5 nm more securely.

Heretofore, the embodiments of the present invention have been described, but the embodiments disclosed herein are illustrative and non-restrictive in any respect. The scope of the present invention is defined by the terms of the claims, rather than the embodiments described above, and is intended to include any modifications within the scope and meaning equivalent to the terms or the claims. For example, in each of the above-mentioned embodiments, the insulating layer provided with the contact hole has the interlayer insulating film and the gate insulating film, but the insulating layer provided with the contact hole can be also configured not to include the gate insulating film. Such a configuration can be obtained by, for example, removing the gate insulating film from the vicinity of the contact hole in advance before forming the contact hole. Moreover, the silicon carbide semiconductor device may be a MISFEET other than the MOSFET. Moreover, the silicon carbide semiconductor device may be a transistor other than the MISFEET, such as an IGBT (Insulated Gate Bipolar Transistor). In this case, instead of the source electrode, an emitter electrode is formed as an electrode layer.

REFERENCE SIGNS UST

10: epitaxial substrate (substrate); 10A upper surface (main surface); 11 base substrate; 11A: interface; 11B backside surface; 12: epitaxial layer; 13: n⁻ drift portion; 14: p body portion; 15: n source portion; 16: p contact portion; 20:

insulating layer; 21: gate insulating film; 22: interlayer insulating film; 30: gate electrode; 51: buffer film; 52: source electrode (electrode layer); 60: source interconnection layer; 70: drain electrode; 80: mask layer; 100: MOSFET (silicon carbide semiconductor device); CH: contact hole; CR: contact region; OP: opening.

The invention claimed is:

1. A method for manufacturing a silicon carbide semiconductor device comprising steps of:
    forming an insulating layer on a substrate having a main surface and made of silicon carbide;
    forming a mask layer on said insulating layer, said mask layer having an opening;
    forming a contact hole in said insulating layer to expose a contact region by etching said insulating layer using said mask layer, said contact region being a portion of said main surface of said substrate, the step of forming said contact hole including a step of providing said contact region with a surface roughness Ra of not less than 0.5 nm;
    forming an electrode layer in contact with said contact region of said substrate; and
    causing siliciding reaction between said electrode layer and said contact region of said substrate by heating said electrode layer and said substrate,
    wherein the step of providing said contact region with a surface roughness Ra of not less than 0.5 nm includes a step of making said contact region rough, and
    wherein the step of making said contact region rough includes steps of: subjecting said contact region to oxygen plasma; and etching said contact region after the step of subjecting said contact region to the oxygen plasma, and the step of etching said contact region is performed under conditions that an etching rate for silicon carbide is larger than an etching rate for silicon oxide.

2. The method for manufacturing the silicon carbide semiconductor device according to claim 1, wherein said substrate has a hexagonal crystal structure.

3. The method for manufacturing the silicon carbide semiconductor device according to claim 2, wherein said main surface of said substrate has an off angle of not more than 10° relative to a {0001} plane.

4. The method for manufacturing the silicon carbide semiconductor device according to claim 1, wherein the step of forming said electrode layer includes a step of depositing a material having at least one of Ni atom and Ti atom.

5. The method for manufacturing the silicon carbide semiconductor device according to claim 1, wherein the step of forming said insulating layer includes a step of providing said insulating layer with a surface roughness Ra of not less than 0.5 nm.

6. The method for manufacturing the silicon carbide semiconductor device according to claim 1, wherein the step of making said contact region rough is repeatedly performed for a plurality of times.

7. The method for manufacturing the silicon carbide semiconductor device according to claim 1, wherein the step of etching said contact region includes a step of performing dry etching using a gas including sulfur hexafluoride.

* * * * *